United States Patent
Tångring et al.

(10) Patent No.: US 9,780,263 B2
(45) Date of Patent: Oct. 3, 2017

(54) OPTOELECTRONIC SEMICONDUCTOR COMPONENT

(71) Applicant: OSRAM Opto Semiconductors GmbH, Regensburg (DE)

(72) Inventors: Ivar Tångring, Regensburg (DE); Andreas Plößl, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/893,121

(22) PCT Filed: Jun. 2, 2014

(86) PCT No.: PCT/EP2014/061382
§ 371 (c)(1),
(2) Date: Nov. 23, 2015

(87) PCT Pub. No.: WO2014/195267
PCT Pub. Date: Dec. 11, 2014

(65) Prior Publication Data
US 2016/0099390 A1    Apr. 7, 2016

(30) Foreign Application Priority Data
Jun. 5, 2013   (DE) .................. 10 2013 105 798

(51) Int. Cl.
*H01L 33/48* (2010.01)
*H01L 33/50* (2010.01)
(Continued)

(52) U.S. Cl.
CPC ............ *H01L 33/502* (2013.01); *H01L 33/44* (2013.01); *H01L 33/486* (2013.01);
(Continued)

(58) Field of Classification Search
CPC ......... H01L 33/60; H01L 33/20; H01L 33/62; H01L 33/54; H01L 33/44
See application file for complete search history.

(56) References Cited

U.S. PATENT DOCUMENTS 4,954,747 A * 9/1990 Tuenge ............... C09K 11/7702
                                                           313/112
5,515,393 A * 5/1996 Okuyama ............ B82Y 20/00
                                                           372/45.01
(Continued)

FOREIGN PATENT DOCUMENTS

DE         101 12 542 A1   10/2002
DE    10 2009 025 266 A1   12/2010
(Continued)

OTHER PUBLICATIONS (Proc. SPIE 3123, Materials Research in Low Gravity, 58 (Jul. 7, 1997), Crystal growth and characterization of vanadium-doped and undoped CdSSe, Jul. 7, 1997).*

(Continued)

*Primary Examiner* — Allen Parker
*Assistant Examiner* — Long H Le
(74) *Attorney, Agent, or Firm* — DLA Plper LLP (US)

(57) ABSTRACT

An optoelectronic semiconductor component includes a luminescent diode chip including a radiation passage face through which primary electromagnetic radiation leaves the luminescent diode chip when in operation, and a filter element that covers the radiation passage face of the luminescent diode chip at least in places, wherein the filter element prevents passage of some of the primary electromagnetic radiation in the UV range, and the filter element consists of a II-VI compound semiconductor material.

18 Claims, 1 Drawing Sheet

(51) Int. Cl.
*H01L 33/44* (2010.01)
*H01L 33/62* (2010.01)

(52) U.S. Cl.
CPC ............ *H01L 33/507* (2013.01); *H01L 33/62* (2013.01); *H01L 2224/48091* (2013.01); *H01L 2224/48465* (2013.01); *H01L 2224/8592* (2013.01); *H01L 2924/181* (2013.01)

(56) References Cited

U.S. PATENT DOCUMENTS

| | | | |
|---|---|---|---|
| 6,020,601 A * | 2/2000 | Noguchi | B82Y 20/00 257/13 |
| 6,222,203 B1 * | 4/2001 | Ishibashi | B82Y 20/00 257/103 |
| 2003/0218180 A1 | 11/2003 | Fujiwara | |
| 2005/0245018 A1 * | 11/2005 | Bogner | H01L 33/486 438/200 |
| 2006/0220053 A1 | 10/2006 | Furukawa et al. | |
| 2008/0265749 A1 * | 10/2008 | Bechtel | H01L 33/44 313/503 |
| 2009/0236619 A1 * | 9/2009 | Chakroborty | H01L 33/44 257/89 |
| 2010/0043873 A1 * | 2/2010 | Kim | H01L 21/02414 136/255 |
| 2011/0156002 A1 | 6/2011 | Leatherdale et al. | |
| 2011/0188530 A1 * | 8/2011 | Lell | H01S 5/0078 372/49.01 |

FOREIGN PATENT DOCUMENTS

| | | |
|---|---|---|
| JP | 2003-298116 A | 10/2003 |
| KR | 10-2005-0024078 A | 3/2005 |

OTHER PUBLICATIONS (Srivani et al. (Investigation of Physical Properties in II-VI Ternary Semiconductors of Sulphides, Selenides and Tellurides. Research Inventy: International Journal of Engineering and Science, vol. 2, Issue 11 (Apr. 2013), pp. 26-35)).*

U Lunz et al., "The energy gap $E_g$ of $Zn_{1-x}Mg_xS_ySe_{1-y}$ epitaxial-layersasa function of composition and temperature," Semicond. Sci. Technol., vol. 12, 1997, pp. 970-973.

* cited by examiner

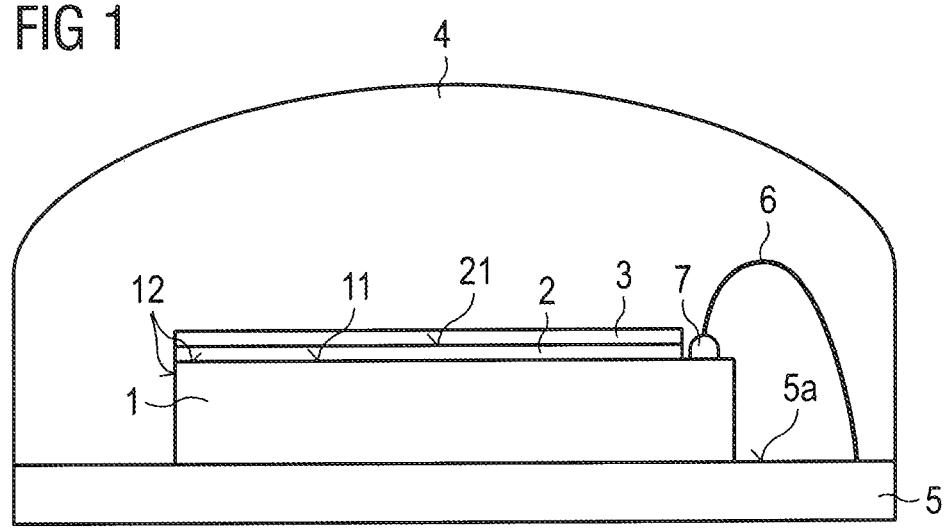
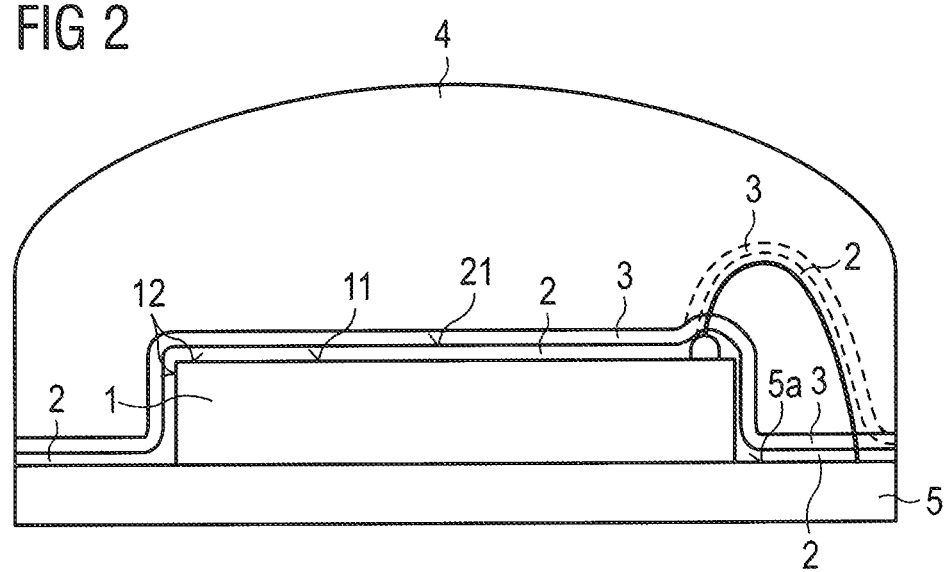

OPTOELECTRONIC SEMICONDUCTOR COMPONENT

TECHNICAL FIELD

This disclosure relates to an optoelectronic semiconductor component.

BACKGROUND

DE 10112542 describes an optoelectronic semiconductor component. There is a need to provide an optoelectronic semiconductor component which is particularly simple and inexpensive to produce.

SUMMARY

We provide an optoelectronic semiconductor component including a luminescent diode chip including a radiation passage face through which primary electromagnetic radiation leaves the luminescent diode chip when in operation, and a filter element that covers the radiation passage face of the luminescent diode chip at least in places, wherein the filter element prevents passage of some of the primary electromagnetic radiation in the UV range, and the filter element consists of a II-VI compound semiconductor material.

We also provide an optoelectronic semiconductor component including a luminescent diode chip including a radiation passage face through which primary electromagnetic radiation leaves the luminescent diode chip when in operation, wherein the primary electromagnetic radiation emitted by the luminescent diode chip when in operation has a peak wavelength, and the peak wavelength of the primary electromagnetic radiation emitted by the luminescent diode chip when in operation lies in a wavelength range of blue light, and a filter element that covers the radiation passage face of the luminescent diode chip at least in places, wherein the filter element prevents passage of some of the primary electromagnetic radiation in the UV range, and the filter element consists of a nominally undoped II-VI compound semiconductor material.

BRIEF DESCRIPTION OF THE DRAWINGS

FIGS. 1 and 2 are schematic sectional representations of optoelectronic semiconductor components described here according to two different examples.

DETAILED DESCRIPTION

Our optoelectronic semiconductor component may comprise a luminescent diode chip. The luminescent diode chip may, for example, be a light-emitting diode chip or a laser diode chip. The luminescent diode chip comprises a radiation passage face. When the luminescent diode chip is in operation, at least some of the primary electromagnetic radiation generated in the luminescent diode chip leaves the luminescent diode chip through the radiation passage face. When in operation, the luminescent diode chip, for example, generates primary electromagnetic radiation in a wavelength range of UV radiation and blue light.

The luminescent diode chip is, for example, a luminescent diode chip based on a nitride compound semiconductor material. Based on nitride compound semiconductor material means that a semiconductor body of the luminescent diode chip or at least part thereof comprises a nitride compound semiconductor material, preferably $Al_nGa_mIn_{1-n-m}N$, or consists thereof, wherein $0 \leq n \leq 1$, $0 \leq m \leq 1$ and $n+m \leq 1$. This material does not absolutely have to exhibit a mathematically exact composition according to the above formula. Instead, it may, for example, comprise one or more dopants and additional constituents. For simplicity's sake, however, the above formula includes only the fundamental constituents of the crystal lattice (Al, Ga, In, N), even if these may in part be replaced and/or supplemented by small quantities of further substances.

The range of maximum intensity, i.e., for example, the peak wavelength of the primary electromagnetic radiation emitted by the luminescent diode chip when in operation is preferably in the range of blue light. At peak wavelength the intensity has, for example, a global maximum as a function of the wavelength. The peak wavelength of the primary radiation is preferably a wavelength of at least 420 nm. The primary electromagnetic radiation may in particular comprise high-energy electromagnetic radiation in the range of UV radiation, which has a lower intensity than the blue light emitted by the luminescent diode chip.

The optoelectronic semiconductor component may comprise a filter element covering the radiation passage face of the luminescent diode chip at least in places. The filter element may be arranged directly on the radiation passage face of the luminescent diode chip, i.e., for example, directly on a semiconductor body of the luminescent diode chip. It is moreover possible for further layers or elements to be located between the filter element and the luminescent diode chip associated with neither the filter element nor the luminescent diode chip. In addition, it is possible for the filter element to cover the entire radiation passage face of the luminescent diode chip.

The filter element may prevent passage of some of the primary electromagnetic radiation. This means that some of the primary electromagnetic radiation is, for example, absorbed or reflected by the filter element and cannot therefore leave the filter element at the outer face thereof remote from the radiation passage face of the luminescent diode chip.

The filter element may consist of a II-VI compound semiconductor material. A II-VI compound semiconductor material comprises at least one element from main and/or subgroup two such as, for example, Zn, Be, Mg, Ca or Sr, and one element from main group six such as, for example, O, S or Se. In particular, a II-VI compound semiconductor material comprises a binary, ternary or quaternary compound, which comprises at least one element from main group two and at least one element from main group six. Such a binary, ternary or quaternary compound may moreover comprise, for example, one or more dopants and additional constituents. The II-VI compound semiconductor materials, for example, include: ZnO, ZnMgO, CdS, ZnCdS, MgBeO.

It is possible for the filter element to comprise different II-VI compound semiconductor materials. Moreover, it is possible for the filter element to be homogeneously formed from a single II-VI compound semiconductor material. The statement that the filter element "consists" of a II-VI compound semiconductor material means in particular that the filter element does not comprise any regions, in particular any layers, of a further, different material. Furthermore, the filter element does not comprise any matrix material, for example, of a plastics material into which particles of a II-VI compound semiconductor material have been introduced.

The filter element is in particular configured to prevent passage of primary electromagnetic radiation in the UV range, i.e., for example, with a wavelength below 430 nm, in particular below 425 nm. This means that the filter element is configured to prevent passage of some of the primary electromagnetic radiation from this wavelength range, for example, at least 30% of the primary radiation from this wavelength range. This fraction is, for example, absorbed in the filter element.

The optoelectronic semiconductor component may comprise a luminescent diode chip comprising a radiation passage face through which the primary electromagnetic radiation leaves the luminescent diode chip when in operation. The optoelectronic semiconductor component further comprises a filter element, which covers the radiation passage face of the luminescent diode chip at least in places. In this case, the filter element prevents passage of some of the primary electromagnetic radiation and the filter element consists of a II-VI compound semiconductor material and prevents passage of primary electromagnetic radiation in the UV range, for example, with a wavelength of below 430 nm.

An optoelectronic semiconductor component is based inter alia on the recognition that the UV fraction of primary electromagnetic radiation generated in a luminescent diode chip may damage downstream, UV-sensitive materials. These UV-sensitive materials may, for example, be plastics materials such as epoxy resins, high-refractive-index silicones or polycarbonates. The UV-sensitive materials may, moreover, be luminescence conversion materials, for example, organic luminescence conversion materials. With our optoelectronic semiconductor component, at least some of the harmful UV radiation is prevented by the filter element from passing through the filter element and thus prevented from reaching the UV-sensitive materials. The filter element may consist of a II-VI compound semiconductor material and may be produced particularly inexpensively using methods conventional in semiconductor technology.

The filter element may consist of one of the following II-VI compound semiconductor materials or of a combination of at least two of the following II-VI compound semiconductor materials: ZnMgSe, ZnSeS, MgZnTe. These three-component II-VI compound semiconductor materials are distinguished, for example, by a particularly steep absorption edge in the wavelength range of 400 to 430 nm at room temperature, in particular in the wavelength range of 405 to 425 nm at room temperature. For wavelengths below the absorption edge, absorption by these materials is particularly high, while for wavelengths above the absorption edge absorption is negligibly low.

The filter element may consist of $Zn_xMg_{(1-x)}Se$. In this case, x may, within the bounds of manufacturing tolerances, for example, be selected to be equal to 0.8. This results in a filter element with a band gap of approximately 3 eV, which corresponds to an absorption edge of approximately 413 nm. If the luminescent diode chip is a blue light-emitting luminescent diode chip with the dominant wavelength $L_{dom}$=445 nm, the intensity loss through such a filter element, which takes the form of a 1 μm thick layer, is around 0.5%, wherein the fraction of primary electromagnetic radiation with a wavelength below 400 nm is greatly reduced, by a factor of about 10.

A filter element of a II-VI compound semiconductor material, in particular a filter element of one of the stated II-VI compound semiconductor materials, is further distinguished in that its filter properties display similar temperature behavior to a luminescent diode chip based on a nitride compound semiconductor material. For example, emission wavelengths of the primary electromagnetic radiation at a temperature of 100° C. for a blue light-emitting nitride-based luminescent diode chip shift by about 5 nm towards higher wavelengths relative to emission at a temperature of 25° C. A filter element of a II-VI compound semiconductor material comprises an absorption edge which behaves similarly in relation to temperature and likewise shifts towards longer wavelengths at higher temperatures. Thus, at an operating temperature of 100° C. undesired radiation components can be cut off at greater wavelengths even than at 25° C.

Our filter element including a II-VI compound semiconductor material, in particular of one of the stated compounds, therefore protects particularly well against UV radiation at high temperatures. Since at high temperatures damage to the stated plastics materials is also increased due to the elevated temperature, the temperature dependence of the absorption edge has a particularly advantageous effect since for these high operating temperatures the proportion of damaging radiation is reduced to a particularly significant extent. Overall, this results in an increased service life for the optoelectronic semiconductor component.

This allows further freedom in the selection of materials for the components downstream of the luminescent diode chip such as enclosure compounds, conversion elements or optical components such as lenses since with the described filter elements for high, potentially harmful temperatures the proportion of UV radiation is reduced, which together allows the use of materials which would otherwise not be suitable due to their rapid aging as a result of their sensitivity to temperature and UV radiation.

The II-VI compound semiconductor material of the filter element may nominally be undoped. This means that the filter element does not have any or only very slight doping. We found that every ionized contamination of the material of the filter element leads to a broadening of the absorption spectrum and thus to a less steep absorption edge. A nominally undoped II-VI compound semiconductor material for use in the filter element is therefore distinguished by a particularly steep absorption edge.

The filter element may comprise a substantially uniform refractive index. This means that the filter element is, for example, not constructed as a filter element with a plurality of layers with different refractive indices but rather, within the bounds of manufacturing tolerances, the filter element has a uniform refractive index. The filtering properties of the filter element are then attributable to absorption on the basis of the band gap of the compound semiconductor material used and not to the properties thereof as an interference filter. In particular, in this example the filter element does not comprise a Bragg reflector or an interference edge filter. Due to the fact that the filter element may have a uniform refractive index, the filter element is particularly simple to produce. In addition, it is possible to form the filter element from a single compound semiconductor material which further simplifies production of the filter element.

The filter element may take the form of a layer of uniform thickness. The thickness of the filter element is in particular at least 0.5 μm and in particular at most 3.5 μm. If it is assumed that the filter element has an absorption coefficient of around 1000/cm, then in one layer of the thickness of 1 μm around 10% of the intensity of the harmful radiation is absorbed on passage through the filter element perpendicular to the main plane of extension of the layer. Added together over all the angles at which primary radiation passes through the filter element, and taking account of the multiple passes due to total reflection at the radiation passage faces of the filter element, absorption of around at least 30% is obtained.

If greater absorption of harmful electromagnetic radiation is desired, this may be established simply by increasing the thickness of the filter element.

The filter element may completely cover the radiation passage face of the luminescent diode chip. In this case all the primary radiation emitted by the luminescent diode chip when in operation passes through the filter element. It is in particular also possible for the filter element to cover the radiation passage face completely, for example, as a layer. In addition, the filter element may be arranged directly on the radiation passage face, for example, as a layer.

The filter element may completely cover the free outer face of the luminescent diode chip. The free outer face of the luminescent diode chip is, for example, that part of the outer face of the luminescent diode chip that does not face a carrier or a connection carrier and/or is not covered by contact structures. For example, the free outer face is formed by the major face remote from the carrier and the side faces of the luminescent diode chip. In this case too, the filter element may, for example, be a layer and in particular be applied directly to the free outer face of the luminescent diode chip.

The filter element may be electrically insulating. This may, for example, be achieved in that the II-VI compound semiconductor materials used for the filter element are nominally undoped. The filter element may assume a dual function: on the one hand the filter element comprises its optical properties to filter harmful primary electromagnetic radiation, while on the other hand the filter element may be used as a passivation layer of the semiconductor body of the luminescent diode chip. In this case, it is possible in particular to dispense with further passivation layers conventionally formed with materials such as silicon dioxide or silicon nitride.

The optoelectronic semiconductor component may comprise a conversion element arranged on the side of the filter element remote from the luminescent diode chip, wherein the conversion element converts at least some of the primary electromagnetic radiation allowed to pass through the filter element into secondary electromagnetic radiation of a different wavelength. To this end, the conversion element comprises at least one luminescence conversion material. For example, the conversion element converts higher energy primary radiation into lower energy secondary radiation. In this way, the optoelectronic semiconductor component may, for example, emit colored light or white mixed radiation. Since the filter element is arranged between the luminescent diode chip and the conversion element, at least some of the harmful UV radiation of the primary electromagnetic radiation is kept away from the conversion element. Luminescence conversion materials that may be damaged by UV radiation may therefore also be used for the conversion element. In particular, the optoelectronic semiconductor component is then also suitable for use with organic luminescence conversion materials.

The filter element may be in direct contact with the luminescent diode chip and/or with the conversion element. This means that the filter element may be arranged directly on the luminescent diode chip and be in direct contact, for example, with a compound semiconductor material of the luminescent diode chip. In this case, the filter element may also be put to particularly good use as an electrical and/or chemical passivation layer for the luminescent diode chip. It is, moreover, alternatively or additionally possible for the filter element to be in direct contact with the conversion element. For example, the filter element may first be deposited onto the outer face of the luminescent diode chip. Then, the conversion element is deposited onto the outer face of the filter element remote from the luminescent diode chip. This allows particularly simple and thus inexpensive production of the optoelectronic semiconductor component. In addition, in this way a particularly compact optoelectronic semiconductor component may be manufactured. Owing to the filter element it is in particular unnecessary to arrange the conversion element at a large distance from the luminescent diode chip since harmful UV radiation is already absorbed by the filter element. The conversion element may therefore be arranged particularly close to the luminescent diode chip, for example, as a thin layer that allows production of an optoelectronic semiconductor component of particularly low structural height.

The conversion element may be configured as a layer of uniform thickness. For example, the filter element is then also configured as a layer of uniform thickness. It is possible for the filter element to be deposited conformally as a layer onto the outer face of the luminescent diode chip and for the conversion element to be deposited conformally as a layer onto the filter element.

The optoelectronic component may comprise a connection carrier. The connection carrier may, for example, be a circuit board, a printed circuit board, a metal-core board, a lead frame, a QFN (Quad Flat No-leads) package or the like. The luminescent diode chip is arranged on a mounting surface of the connection carrier. It is then possible for regions of the mounting surface not covered by the luminescent diode chip to be covered by the filter element. The filter element may also constitute protection for the connection carrier. For example, the connection carrier may be formed in places with a plastics material that yellows under action of UV radiation. The connection carrier may also comprise further package parts such as, for example, a reflector cavity of a plastics material which may likewise be protected from harmful UV radiation by the filter element. The filter element then also covers regions of the connection carrier not covered by the luminescent diode chip and therefore protects these regions of the connection carrier from harmful UV radiation. This provides protection not only from the primary radiation emitted by the luminescent diode chip when in operation but, for example, also protection from sunlight.

The conversion element may completely cover the free outer face of the filter element. This means that all the outer faces of the filter element not covered may be covered by the conversion element. This is in particular also possible in regions of the filter element arranged, for example, directly on a mounting surface of the connection carrier of the optoelectronic semiconductor component. For example, when producing the optoelectronic semiconductor component, first, the connection carrier with luminescent diode chip arranged thereon is coated with the material of the filter element. Then, without using an additional mask, the luminescence conversion material of the conversion element is deposited to form the conversion element. In this way, material of the conversion element is then also located outside the luminescent diode chip. For example, primary electromagnetic radiation exiting from uncovered side faces of the luminescent diode chip and which would not otherwise pass through the conversion element may impinge on luminescence conversion material of the conversion element arranged to the side of the luminescent diode chip and is therefore partly also converted. In this way, "blue piping," i.e., the unwanted exit of blue light in particular at side edges of the luminescent diode chip not covered by the conversion element, may be compensated.

The filter element may be deposited by sputtering. A mask may also be used for deposition of the material of the filter element. Deposition by sputtering proves particularly advantageous since the filter element may be produced particularly uniformly and inexpensively in a uniform layer thickness.

Our optoelectronic semiconductor component is distinguished inter alia in that, on deposition of the filter element, for example, by sputtering, only low process temperatures are necessary such that production of the filter element may also take place after application of metallization or after method steps such as adhesive bonding, sintering, wirebonding or eutectic wafer bonding without damage to the previously produced connections and structures occurring during production of the filter element. For example, the filter element may be applied to the luminescent diode chip at temperatures of below 150° C.

A further advantage of an optoelectronic semiconductor component is the fact that materials such as epoxy resins, high-refractive-index silicones or polycarbonates that are UV-sensitive may be used, for example, to enclose the luminescent diode chip. In this way, the emission efficiency of the optoelectronic semiconductor component may also be increased over conventional optoelectronic semiconductor components since these materials have a high refractive index and thus allow efficient light outcoupling from the chip. When using conventional materials, for example, for the material enclosing the luminescent diode chip, aging thereof is reduced and the service life further increased. The filter element further makes it possible to arrange other components of the optoelectronic semiconductor component such as, for example, lenses or other optical elements, particularly close to the luminescent diode chip. This enables a particularly compact optoelectronic semiconductor component.

Optoelectronic semiconductor components described here are explained in greater detail below with reference to examples and the associated figures.

Identical, similar or identically acting elements are provided with identical reference numerals in the figures. The figures and the size ratios of the elements illustrated in the figures relative to one another are not to be regarded as being to scale. Rather, individual elements may be illustrated on an exaggeratedly large scale for greater ease of depiction and/or better comprehension.

The schematic sectional representation of FIG. 1 shows a first example of an optoelectronic semiconductor component. The optoelectronic semiconductor component comprises a connection carrier 5. The connection carrier 5 may, for example, be part of a package in which electrically conductive structures are formed by conductor tracks or a lead frame. Furthermore, the connection carrier 5 may be a circuit board, for example, a printed circuit board.

The connection carrier 5 comprises a mounting surface 5a, on which a luminescent diode chip 1 is applied.

The luminescent diode chip 1 is, for example, a light-emitting diode chip based on a nitride compound semiconductor material and emits blue light when in operation. The luminescent diode chip 1 comprises a radiation passage face 11 through which primary electromagnetic radiation generated in the luminescent diode chip 1 when in operation at least partly leaves the latter.

A filter element 2 is arranged in direct contact on the radiation passage face 11. The filter element 2 consists of a II-VI compound semiconductor material. For example, the filter element 2 is formed with an undoped $Zn_{0.8}Mg_{0.2}Se$. The filter element 2 may be applied to the luminescent diode chip 1 by sputtering. To this end, a mask may, for example, be used to keep the contact region 7 for electrical connection of the luminescent diode chip free of the material of the filter element 2. In the example of FIG. 1, the filter element 2 has a uniform thickness of, for example, 1 μm.

The filter element 2 reduces the fraction of the primary electromagnetic radiation having a wavelength of below around 400 nm roughly by a factor of 10. Overall, the intensity of the light emitted by the luminescent diode chip when in operation is however reduced only by around 0.5%.

On the side of the filter element 2 remote from the luminescent diode chip 1, the conversion element 3 that completely covers the face of the filter element 2 remote from the luminescent diode chip, is arranged on the free outer face 21 of the filter element 2. The conversion element 3 converts some of the primary electromagnetic radiation passing through the filter element 2 into secondary radiation such that the optoelectronic semiconductor component, for example, emits white mixed light.

The luminescent diode chip 1 electrically conductively connects to the connection carrier 5 at the contact region 7 by a contact wire 6. All the components described are surrounded by the enclosure material 4 which may, for example, be a UV-sensitive high-refractive-index silicone.

A further example of an optoelectronic semiconductor component is explained in greater detail in conjunction with the schematic sectional representation of FIG. 2. In contrast to the example of FIG. 1, when producing this optoelectronic semiconductor component no masks are used in deposition of the filter element and of the conversion element.

For this reason, the entire free outer face 12 of the luminescent diode chip 1 is covered by material of the filter element 2 and material of the conversion element 3.

This means that the luminescent diode chip 1 is enclosed by a single, conformal filter coating. The conversion element 3 succeeds the filter element 2 conformally as a layer.

The regions of the mounting surface 5a of the connection carrier 5 not covered by the luminescent diode chip 1 are likewise also covered with the filter element 2 and the conversion element 3. In this way, these regions of the connection carrier are also protected from harmful UV radiation. The material of the filter element 2 additionally also covers the contact wire 6 and the contact region 7 for electrical connection of the luminescent diode chip 1. The material of the filter element 2 is completely covered by the material of the conversion element 3.

The filter element may here in particular also have electrically insulating properties such that it represents passivation for the luminescent diode chip and, in the example of FIG. 2, also for the connection carrier.

The description made with reference to examples does not restrict this disclosure. Rather, our components encompass any novel feature and any combination of features, including in particular any combination of features in the appended claims, even if the feature or combination is not itself explicitly indicated in the claims or examples.

This application claims priority DE 102013105798.5, the disclosure of which is hereby incorporated by reference.

The invention claimed is:

1. An optoelectronic semiconductor component comprising:
   a luminescent diode chip comprising a radiation passage face through which primary electromagnetic radiation leaves the luminescent diode chip when in operation; and
   a filter element that covers the radiation passage face of the luminescent diode chip at least in places, wherein the filter element prevents passage of some of the primary electromagnetic radiation in the UV range, and the filter element consists of a nominally undoped ternary or quaternary II-VI compound semiconductor material.

2. The optoelectronic semiconductor component according to claim 1, wherein the primary electromagnetic radiation emitted by the luminescent diode chip when in operation has a peak wavelength, the peak wavelength of the primary electromagnetic radiation emitted by the luminescent diode chip when in operation lies in a wavelength range of blue light, and the II-VI compound semiconductor material of the filter element is nominally undoped.

3. The optoelectronic semiconductor component according to claim 1, wherein the filter element consists of one or two or more of: ZnMgSe, ZnSeS and MgZnTe.

4. The optoelectronic semiconductor component according to claim 1, wherein the primary electromagnetic radiation emitted by the luminescent diode chip when in operation has a peak wavelength, the peak wavelength of the primary electromagnetic radiation emitted by the luminescent diode chip when in operation lies in a wavelength range of blue light, the II-VI compound semiconductor material of the filter element is nominally undoped, and the filter element consists of one or two or more of: ZnMgSe, ZnSeS and MgZnTe.

5. The optoelectronic semiconductor component according to claim 1, wherein the II-VI compound semiconductor material of the filter element is nominally undoped.

6. The optoelectronic semiconductor component according to claim 1, wherein the filter element has a substantially uniform refractive index.

7. The optoelectronic semiconductor component according to claim 1, wherein the filter element is configured as a layer of uniform thickness, and the thickness is at least 0.5 µm and at most 3.5 µm.

8. The optoelectronic semiconductor component according to claim 1, wherein the filter element completely covers the radiation passage face.

9. The optoelectronic semiconductor component according to claim 1, wherein the filter element completely covers the free outer face of the luminescent diode chip.

10. The optoelectronic semiconductor component according to claim 1, wherein the filter element is electrically insulating.

11. The optoelectronic semiconductor component according to claim 1, further comprising a conversion element arranged on a side of the filter element remote from the luminescent diode chip, wherein the conversion element converts at least some of the primary electromagnetic radiation into secondary electromagnetic radiation of a different wavelength.

12. The optoelectronic semiconductor component according to claim 11, wherein the filter element directly contacts the luminescent diode chip and/or the conversion element.

13. The optoelectronic semiconductor component according to claim 11, wherein the conversion element is configured as a layer of uniform thickness.

14. The optoelectronic semiconductor component according to claim 11, wherein the conversion element completely covers a free outer face of the filter element.

15. The optoelectronic semiconductor component according to claim 1, further comprising a connection carrier on which the luminescent diode chip is arranged on a mounting surface, wherein regions of the mounting surface not covered by the luminescent diode chip are covered by the filter element.

16. The optoelectronic semiconductor component according to claim 1, wherein the filter element is deposited by sputtering.

17. An optoelectronic semiconductor component comprising:

a luminescent diode chip comprising a radiation passage face through which primary electromagnetic radiation leaves the luminescent diode chip when in operation; and a filter element that covers the radiation passage face of the luminescent diode chip at least in places, wherein the filter element prevents passage of some of the primary electromagnetic radiation in the UV range, and the filter element consists of ZnMgSe.

18. An optoelectronic semiconductor component comprising:

a luminescent diode chip comprising a radiation passage face through which primary electromagnetic radiation leaves the luminescent diode chip when in operation; and a filter element that covers the radiation passage face of the luminescent diode chip at least in places, wherein the filter element prevents passage of some of the primary electromagnetic radiation in the UV range, and the filter element consists of MgZnTe.

* * * * *